United States Patent [19]

Park

[11] Patent Number: 5,596,533

[45] Date of Patent: Jan. 21, 1997

[54] METHOD AND APPARATUS FOR READING/WRITING DATA FROM/INTO SEMICONDUCTOR MEMORY DEVICE

[75] Inventor: Kee W. Park, Kyoungki-do, Rep. of Korea

[73] Assignee: Hyundai Electronics Industries Co., Ltd., Kyoungki-do, Rep. of Korea

[21] Appl. No.: 626,549

[22] Filed: Apr. 2, 1996

[30] Foreign Application Priority Data

Apr. 7, 1995 [KR] Rep. of Korea .................. 95-8131

[51] Int. Cl.$^6$ ...................... G11C 7/00; G11C 8/00
[52] U.S. Cl. ...................... 365/189.04; 365/189.02; 365/207; 365/230.03
[58] Field of Search ............... 365/189.02, 189.04, 365/207, 230.02, 230.03, 230.06

[56] References Cited

U.S. PATENT DOCUMENTS

| | | | |
|---|---|---|---|
| 5,479,373 | 12/1995 | Takeuchi et al. | 365/189.04 X |
| 5,497,352 | 3/1996 | Magore | 365/230.06 X |
| 5,553,032 | 9/1996 | Taguchi | 365/207 X |
| 5,555,206 | 9/1996 | Uchida | 365/207 X |

*Primary Examiner*—Do Hyun Yoo
*Attorney, Agent, or Firm*—Gary M. Nath; Nath & Associates

[57] ABSTRACT

A method and an apparatus for reading/writing data from/into a semiconductor memory device. In a read mode, a memory cell array block from which data is to be read is selected in response to a row address signal and a column of the selected memory cell array block is selected in response to a column address signal. Data are transferred from a memory cell of the selected column to a pair of bit lines of the selected column and then sense-amplified. A read signal is decoded and a pair of column decoding lines of the selected column become a desired logic state in accordance with the decoded result. A current path is formed between one of the column decoding lines and a ground terminal in response to the sense-amplified data on the bit lines. Data on the column decoding lines are selected and sense-amplified. The sense-amplified data are transferred externally. In a write mode, a memory cell array block into which data is to be written is selected in response to the row address signal and a column of the selected memory cell array block is selected in response to the column address signal. A pair of column decoding lines of the selected column become a desired logic state in response to a write signal. Data on one of the column decoding lines is transferred to a bit line sense amplifier connected to a memory cell of the selected column.

13 Claims, 5 Drawing Sheets

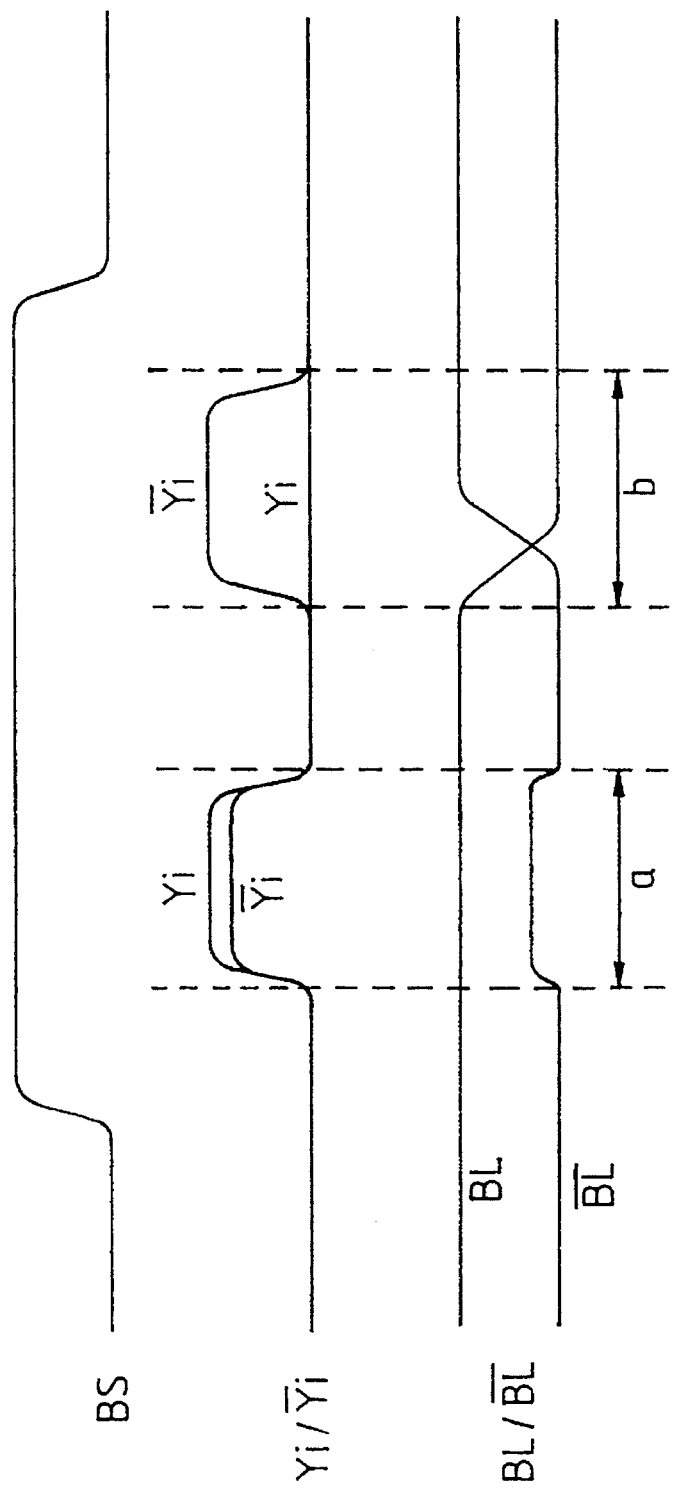

5,596,533

METHOD AND APPARATUS FOR READING/WRITING DATA FROM/INTO SEMICONDUCTOR MEMORY DEVICE

BACKGROUND OF THE INVENTION

1. Field of the Invention

The present invention relates in general to a method and an apparatus for reading/writing data from/into a semiconductor memory device, and more particularly to a method and an apparatus for reading/writing data from/into a semiconductor memory device, in which, instead of true and complementary data input/output lines connected respectively to true and complementary bit lines, true and complementary column decoding lines are used to perform data read/write operations, thereby reducing the area of a semiconductor memory chip.

2. Description of the Prior Art

Referring to FIG. 1, there is shown a circuit diagram of a conventional data read/write apparatus for a semiconductor memory device such as a dynamic random access memory (referred to hereinafter as DRAM) device. As shown in this drawing, the DRAM device comprises a plurality of memory cell array blocks 10, each of which includes a plurality of memory cells 11 for storing data therein. Although not shown, each of the memory cells 11 is provided with one NMOS transistor and one capacitor.

The conventional data read/write apparatus comprises a plurality of bit line sense amplifier array blocks 12, each of which includes a plurality of bit line sense amplifiers 13 for sense-amplifying the data which are transferred from the memory cells 11 to true and complementary bit lines BL and /BL.

The conventional data read/write apparatus further comprises transfer transistors Q1 and Q3 for transferring the data on the bit lines BL to a true data input/output line IO in response to an output signal Yi from a column decoder (not shown), transfer transistors Q2 and Q4 for transferring the data on the bit lines BL to a complementary data input/output line /IO in response to the output signal Yi from the column decoder, a read sense amplifier 15 for sense-amplifying the data on the data input/output lines IO and /IO and transferring the sense-amplified data to a data output buffer (not shown), and a write driver 14 for transferring external write data to the data input/output lines IO and /IO.

Although not shown, a precharge circuit is provided to maintain the true and complementary bit lines BL and /BL at a precharge voltage level Vblp in a standby mode.

The operation of the conventional data read/write apparatus for the DRAM device with the above-mentioned construction will hereinafter be described.

First, when a signal /RAS which is a main signal for operating the DRAM device is made active, address signals from an address buffer (not shown) are received. At this time, a row decoding operation is performed which decodes the received address signals and selects one of word lines to the memory cell array block 10 in accordance with the decoded result. Data from the memory cells 11 connected to the selected word line are placed on the bit lines BL and /BL. At this time, the data placed on the bit lines BL and /BL have a feeble signal level. For this reason, the bin line sense amplifiers 13 are driven to sense-amplify the data on the bit lines BL and /BL to a supply voltage level Vcc and a ground voltage level vss. The transfer transistors Q1–Q4 act to transfer the data on the bit lines BL and /BL, sense-amplified by the bit line sense amplifiers 13, respectively to the data input/output lines IO and /IO in response to the output signal Yi from the column decoder. In more detail, the transfer transistors Q1–Q4 select one of columns in response to the output signal Yi from the column decoder. The data on the bit lines BL and /BL of the selected column are placed respectively on the data input/output lines IO and /IO by the turned-on transfer transistors Q1 and Q2 or Q3 and Q4. Then, the read sense amplifier 15 sense-amplifies the data on the data input/output lines IO and /IO and transfers the sense-amplified data to the data output buffer. On the other hand, external write data are placed on the data input/output lines IO and /IO by the write driver 14. The write data placed on the data input/output lines IO and /IO are written into the memory cell 11 by the bit line sense amplifier 13 of a column selected by the output signal Yi from the column decoder.

Referring to FIG. 2, there is shown a circuit diagram of another conventional data read/write apparatus for a semiconductor memory device. Some parts in this drawing are the same as those in FIG. 1. Therefore, like reference numerals designate like parts. As shown in this drawing, the true and complementary bit lines BL and /BL are connected to a plurality of true and complementary input/output lines IO0 and /IO0 and IO1 and /IO1 to embody a wide bit memory capacity.

In FIG. 2, a plurality of columns are simultaneously selected by one column address. In order to simultaneously read a plurality of data from the memory cells 11 in the selected columns, the same number of true and complementary input/output lines as the selected columns are required. For this reason, many true and complementary input/output lines to each bit line sense amplifier are required in wide bit memory devices with a large number of input/output bits. This results in an increase in the area of a semiconductor memory chip.

SUMMARY OF THE INVENTION

Therefore, the present invention has been made in view of the above problem, and it is an object of the present invention to provide a method and an apparatus for reading/writing data from/into a semiconductor memory device, in which, instead of true and complementary data input/output lines connected respectively to true and complementary bit lines, true and complementary column decoding lines are used to perform data read/write operations, thereby reducing the area of a semiconductor memory chip.

In accordance with one aspect of the present invention, there is provided a method for reading data from a semiconductor memory device, comprising the steps of selecting a memory cell array block from which data is to be read, in response to a row address signal; selecting a column of the selected memory cell array block in response to a column address signal; sense-amplifying data which are transferred from a memory cell of the selected column to a pair of bit lines of the selected column; decoding a read signal and allowing a pair of column decoding lines of the selected column to become a desired logic state in accordance with the decoded result; forming a current path between one of the column decoding lines and a ground terminal in response to the sense-amplified data on the bit lines; selecting data on the column decoding lines; and sense-amplifying the selected data and outputting the sense-amplified data externally.

In accordance with another aspect of the present invention, there is provided a method for writing data into a semiconductor memory device, comprising the steps of selecting a memory cell array block into which data is to be written, in response to a row address signal; selecting a column of the selected memory cell array block in response to a column address signal; allowing a pair of column decoding lines of the selected column to become a desired logic state in response to a write signal; transferring data on one of the column decoding lines to a bit line sense amplifier connected to a memory cell of the selected column; and restoring data on the other column decoding line to a logic state opposite to that of the data on the one column decoding line.

In accordance with a further aspect of the present invention, there is provided a method for reading/writing data from/into a semiconductor memory device, comprising the steps of reading data from the semiconductor memory device, the data reading step including the first step of selecting a memory cell array block from which data is to be read, in response to a row address signal; the second step of selecting a column of the memory cell array block selected at the first step in response to a column address signal; the third step of sense-amplifying data which are transferred from a memory cell of the column selected at the second step to a pair of bit lines of the selected column; the fourth step of decoding a read signal and allowing a pair of column decoding lines of the column selected at the second step to become a first logic state in accordance with the decoded result; the fifth step of forming a current path between one of the column decoding lines and a ground terminal in response to the sense-amplified data on the bit lines; the sixth step of selecting data on the column decoding lines; and the seventh step of sense-amplifying the selected data and outputting the sense-amplified data externally; and the step of writing data into the semiconductor memory device, the data writing step including the eighth step of selecting a memory cell array block into which data is to be written, in response to the row address signal; the ninth step of selecting a column of the memory cell array block selected at the eighth step in response to the column address signal; the tenth step of allowing a pair of column decoding lines of the column selected at the ninth step to become a second logic state in response to a write signal; the eleventh step of transferring data on one of the column decoding lines to a bit line sense amplifier connected to a memory cell of the column selected at the ninth step; and the twelfth step of restoring data on the other column decoding line to a logic state opposite to that of the data on the one column decoding line.

In accordance with yet another aspect of the present invention, there is provided an apparatus for reading/writing data from/into a semiconductor memory device, comprising bit line sense amplification means for sense-amplifying data which are transferred from memory cells to a pair of bit lines; column decoding means for outputting a first logic signal to a pair of column decoding lines in a read mode and a second logic signal to the pair of column decoding lines in a write mode in response to a column address signal, write input/output signals and a read/write signal; first transfer transistor means connected between the bit lines and the column decoding lines, the first transfer transistor means being driven in response to a block selection row address signal; second transfer transistor means connected in a cross coupled manner between the first transfer transistor means and the column decoding lines, the second transfer transistor means being driven in response to logic signals on the column decoding lines; multiplexing means for transferring data on the column decoding lines of a selected column; and read sense amplification means for sense-amplifying the data transferred by the multiplexing means and transferring the sense-amplified data to a data output buffer,

BRIEF DESCRIPTION OF THE DRAWINGS

The above and other objects, features and advantages of the present invention will be more clearly understood from the following detailed description taken in conjunction with the accompanying drawings, in which:

FIG. 6 is a timing diagram illustrating the operation of the data read/write apparatus in FIG. 3.

DETAILED DESCRIPTION OF THE PREFERRED EMBODIMENTS

Figure 1:
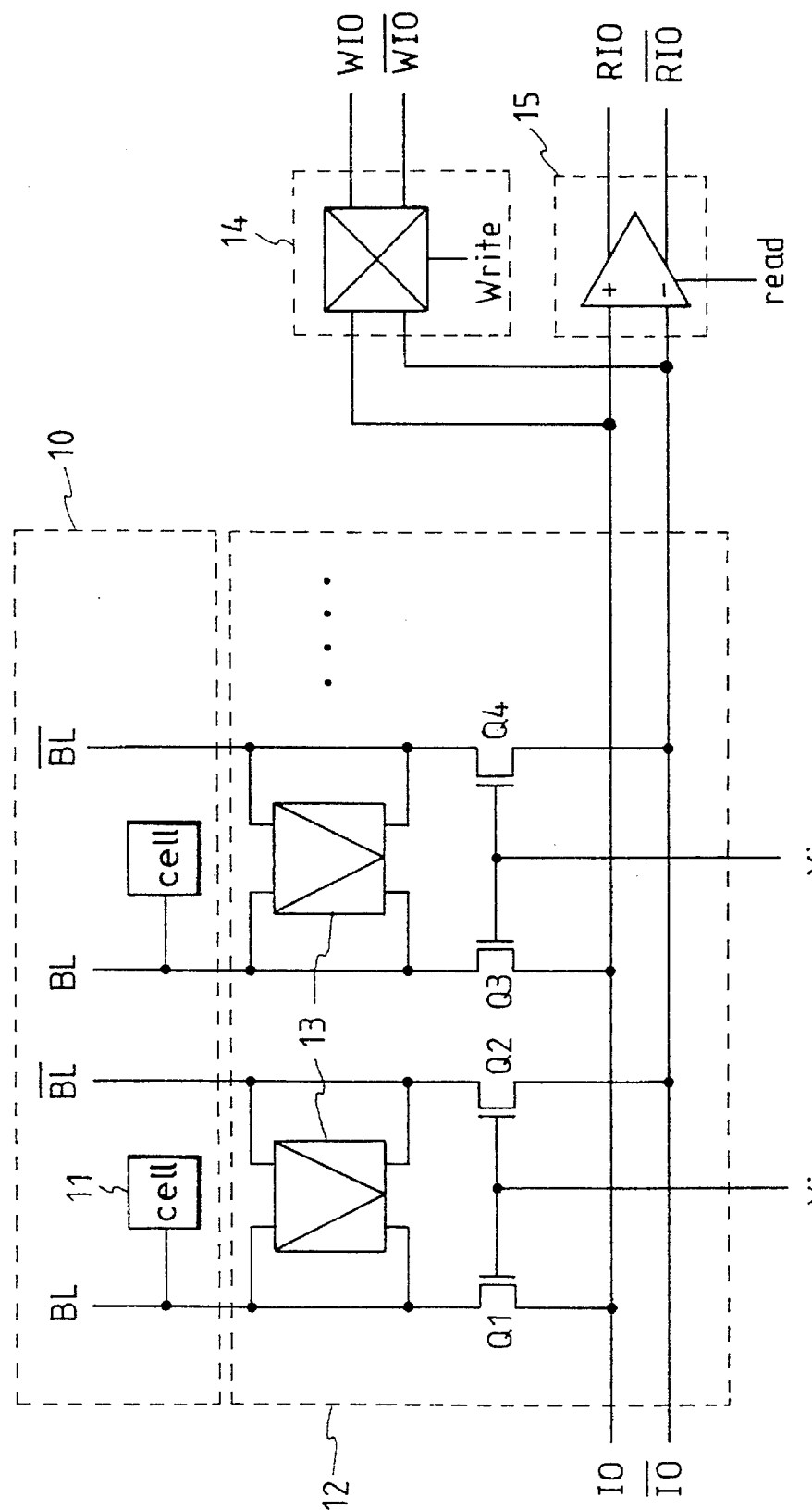
FIG. 1 is a circuit diagram of a conventional data read/write apparatus for a semiconductor memory device.
Figure 2:
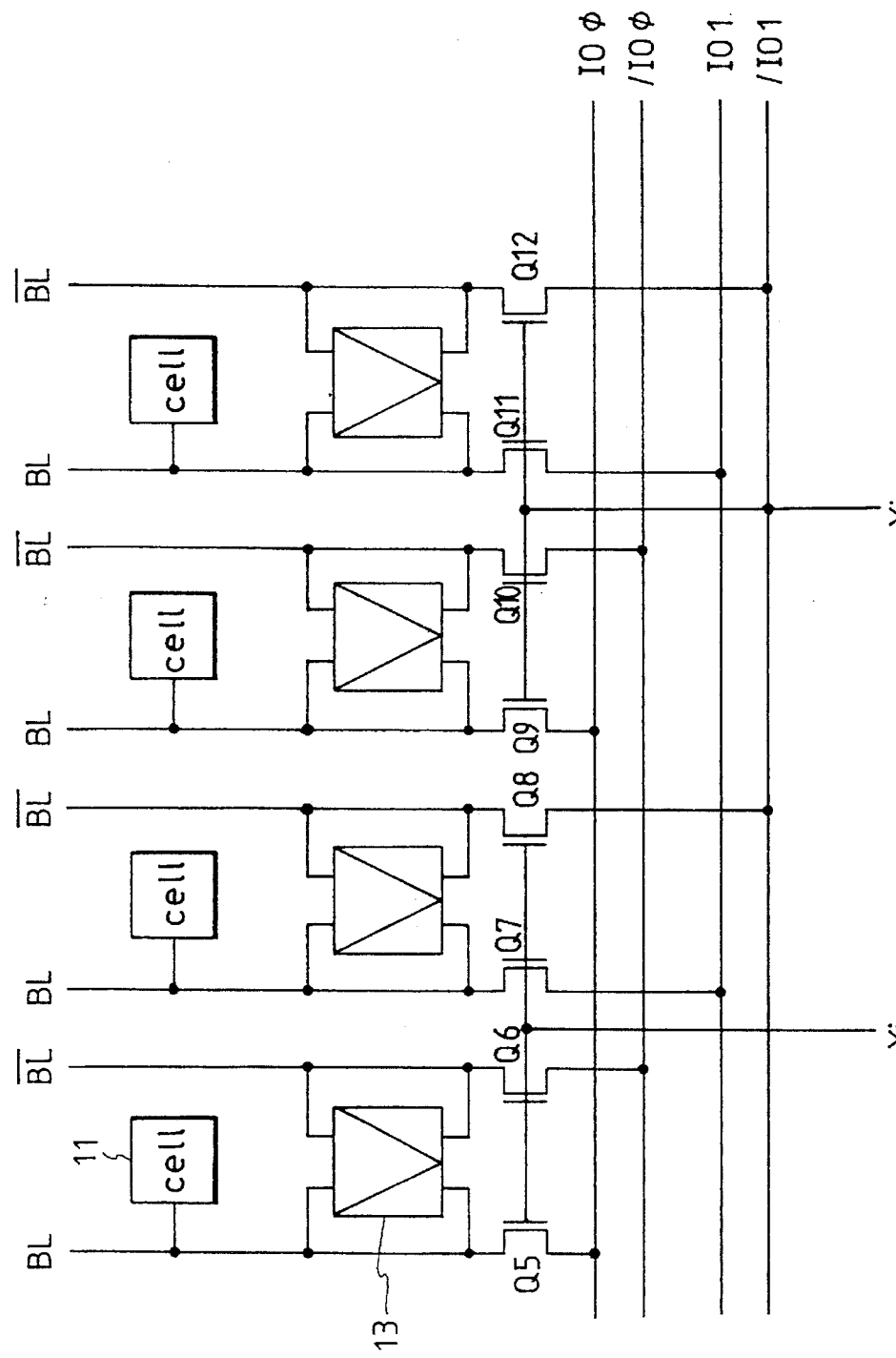
FIG. 2 is a circuit diagram of another conventional data read/write apparatus for a semiconductor memory device.
Figure 3:
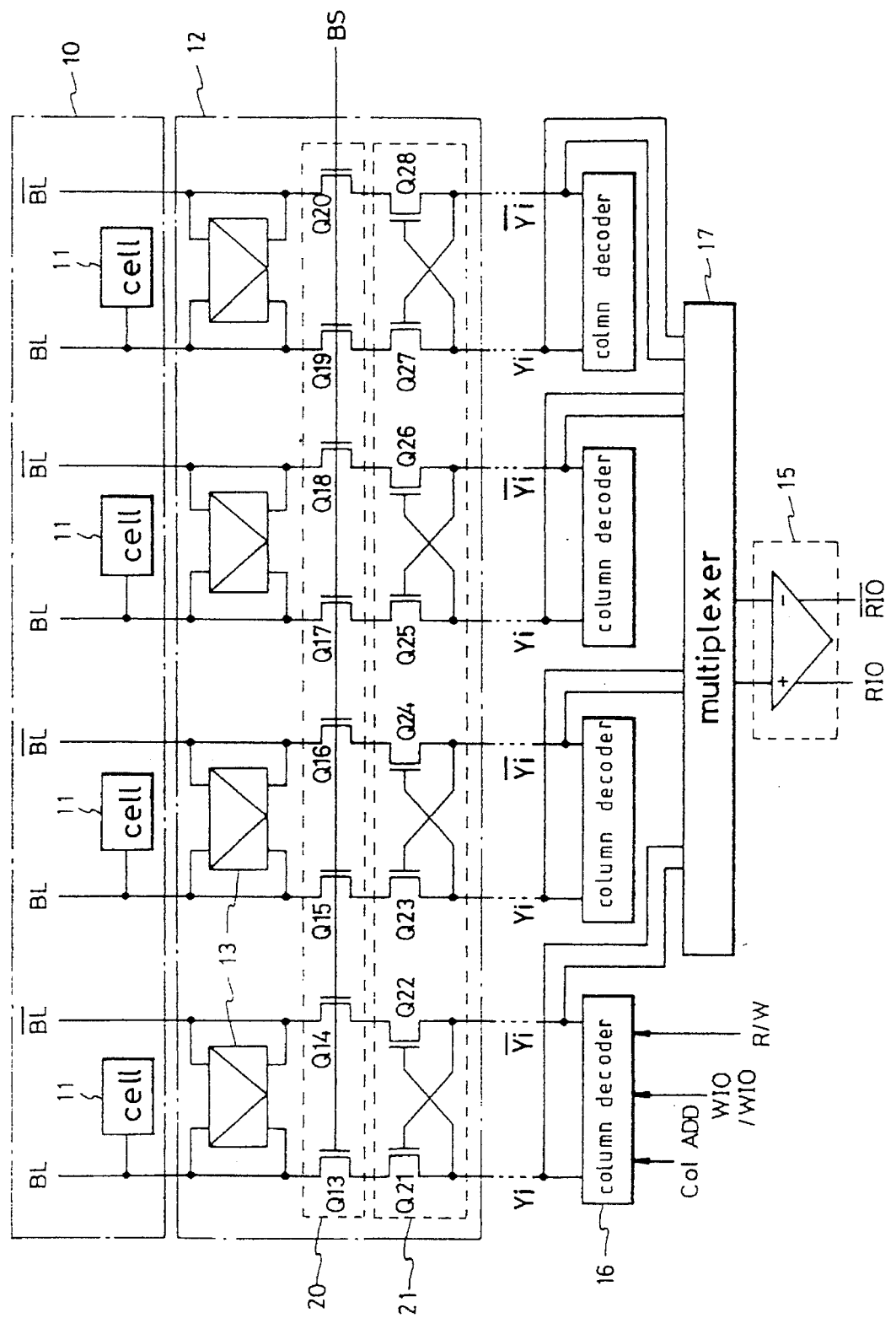
FIG. 3 is a circuit diagram of a data read/write apparatus for a semiconductor memory device in accordance with a first embodiment of the present invention.

Referring to FIG. 3, there is shown a circuit diagram of a data read/write apparatus for a semiconductor memory device in accordance with a first embodiment of the present invention. Some parts in this drawing are the same as those in FIGS. 1 and 2. Therefore, like reference numerals designate like parts.

As shown in FIG. 3, the data read/write apparatus comprises a plurality of column decoders 16 being driven in response to a column address signal Col ADD, write input/output signals WIO and /WIO and a read/write signal R/W. As being driven, each of the column decoders 16 outputs a first logic signal to true and complementary column decoding lines Yi and /Yi in a read mode and a second logic signal to the column decoding lines Yi and /Yi in a write mode.

The data read/write apparatus further comprises a first transfer transistor part 20 connected between a sense amplifier part and a second transfer transistor part 21. The first transfer transistor part 20 is adapted to transfer the data on the bit lines BL and /BL, amplified by the bit line sense amplifiers 13, to the second transfer transistor part 21 in response to a block selection row address signal BS. The second transfer transistor part 21 is connected in a cross coupled manner between the first transfer transistor part 20 and the column decoding lines Yi and /Yi. The second transfer transistor part 21 is adapted to transfer the data transferred by the first transfer transistor part 20 to the column decoding lines Yi and /Yi in response to logic signals on the column decoding lines Yi and /Yi.

The data read/write apparatus further comprises a multiplexing circuit 17 for transferring the transferred data on the column decoding lines Yi and /Yi of a selected column to the read sense amplifier 15.

The operation of the data read/write apparatus for the semiconductor memory device with the above-mentioned construction in accordance with the first embodiment of the present invention will hereinafter be described in detail.

The read/write signal R/W is supplied to the column decoders 16 to discriminate between the read and write modes. In the read mode, one of the column decoders 16 is selected by the column address signal Col ADD. The selected column decoder 16 outputs a high logic signal to both the column decoding lines Yi and /Yi because write data is ignored by the read/write signal R/W. In the second transfer transistor part 21, a pair of NMOS transistors with a cross-coupled structure are turned on in response to the high logic signals on the column decoding lines Yi and /Yi. As a result, a current path is formed between the selected column decoder 16 and the bit line sense amplifier 13 of the same column through one of the column decoding lines Yi and /Yi, latched into low in logic by the bit line sense amplifier 13.

With reference to FIG. 6 which is a timing diagram illustrating the operation of the data read/write apparatus, the reference character a indicates a read cycle interval. In the read mode, the level of first high logic data on the complementary column decoding line /Yi becomes a little lower than that of first high logic data on the true column decoding line Yi because of a current path to the bit line sense amplifier 13. Similarly, the level of first low logic data on the complementary bit line/BL becomes a little higher than that of general low logic data under the influence of the complementary column decoding line/Yi.

The multiplexing circuit 17 transfers the data on the true and complementary column decoding lines Yi and /Yi of the selected column to the read sense amplifier 15. Then, the read sense amplifier 15 sense-amplifies the data transferred by the multiplexing circuit 17 and transfers the sense-amplified data to the data output buffer.

In the write mode, the read/write signal R/W is supplied to the column decoders 16 to discriminate between the read and write modes. Only one of the true and complementary column decoding lines Yi and /Yi selected by the column address signal Col ADD goes high in logic in response to write data received by the read/write signal R/W. Provided that the write data is high in logic, the true column decoding line Yi will become high in logic and the complementary column decoding line /Yi will become low in logic. To the contrary, if the write data is low in logic, the true column decoding line Yi will become low in logic and the complementary column decoding line /Yi will become high in logic. In the second transfer transistor part 21, one of the pair of NMOS transistors with the cross-coupled structure is turned on in response to the high logic column decoding line being connected to its gate terminal. The turned-on NMOS transistor transfers low logic data on the other column decoding line to the bit line sense amplifier 13 of the same column. The bit line sense amplifier 13 writes the transferred low logic data from the turned-on NMOS transistor into the memory cell 11 of the same column through a corresponding one of the bit lines BL and /BL. At this time, the bit line sense amplifier 13 restores the other bit line to high in logic.

with reference to FIG. 6, the reference character b indicates a write cycle interval. In the write mode, for example, if the true column decoding line Yi becomes low in logic, the complementary column decoding line /Yi goes high in logic. The true and complementary bit lines BL and /BL have inverted ones of the data values on the true and complementary column decoding lines Yi and /Yi, respectively.

On the other hand, the block selection row address signal BS is applied to gate terminals of NMOS transistors in the first transfer transistor part 20 to maintain blocks, not selected, at low logic states in the read/write modes. As a result, the block selection row address signal BS functions to prevent the bit lines of the non-selection blocks from being driven when the column decoding lines become high in logic. Also, the second transfer transistor part 21 with the cross coupled structure acts to prevent the flow of data in the non-selection columns.

In this manner, the data can be freely read and written with no increase in the number of input/output lines when a plurality of column decoders in one block are enabled. Therefore, the present invention has the effect of reducing the area of a semiconductor memory chip.

Figure 4:
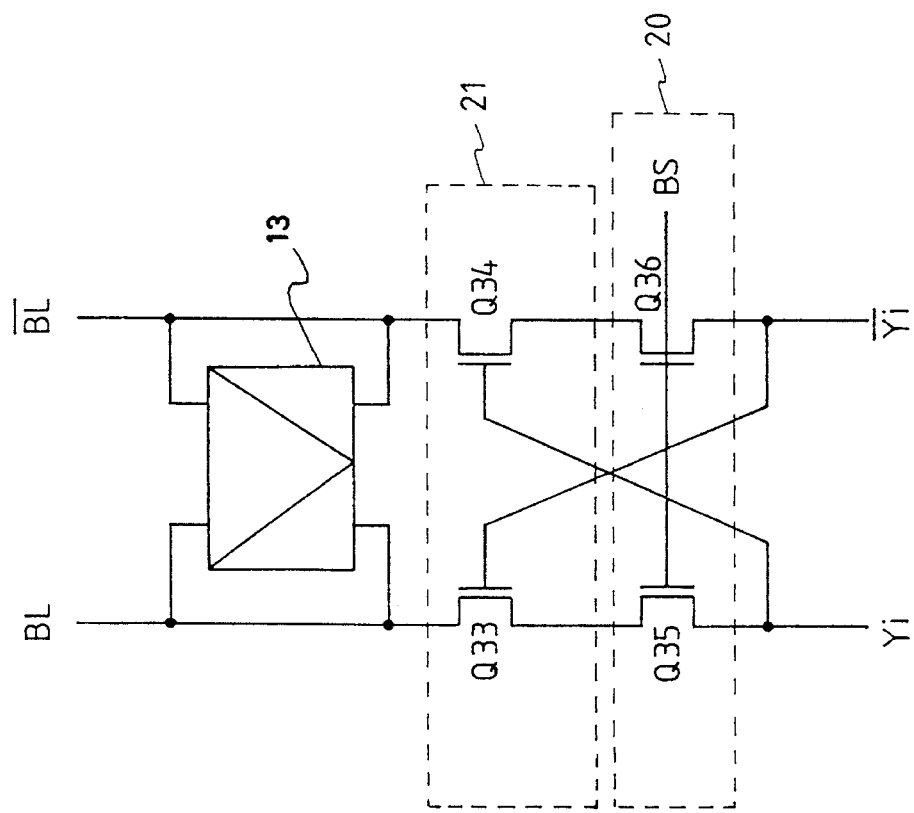
FIG. 4 is a circuit diagram of a data read/write apparatus for a semiconductor memory device in accordance with a second embodiment of the present invention.

Referring to FIG. 4, there is shown a circuit diagram of a data read/write apparatus for a semiconductor memory device in accordance with a second embodiment of the present invention. As shown in this drawing, the construction of the second embodiment is the same as that of the first embodiment in FIG. 3, with the exception that the second transfer transistor part 21 includes a pair of NMOS transistors Q29 and Q30 cross coupled between the bit line sense amplifier 13 and the first transfer transistor part 20, and the first transfer transistor part 20 includes a pair of NMOS transistors Q31 and Q32 connected between the second transfer transistor part 21 and the column decoding lines Yi and /Yi and having their gate terminals for commonly inputting the block selection row address signal BS.

The operation of the second embodiment with the above-mentioned construction is performed in a similar manner to that of the first embodiment and a description thereof will thus be omitted. Noticeably, a load between the second transfer transistor part 21 and the first transfer transistor part 20 is separated from the column decoding lines Yi and /Yi in non-selection blocks. As a result, a small amount of power is consumed when the column decoding lines Yi and /Yi make a transition. However, a voltage drop may occur due to a loss resulting from threshold voltages of the NMOS transistors Q31 and Q32 in the first transfer transistor part 20 when the column decoding lines Yi and /Yi in a selected block become high in logic. In order to prevent such a voltage drop, the block selection row address signal BS to the first transfer transistor part 20 must be bootstrapped.

Figure 5:
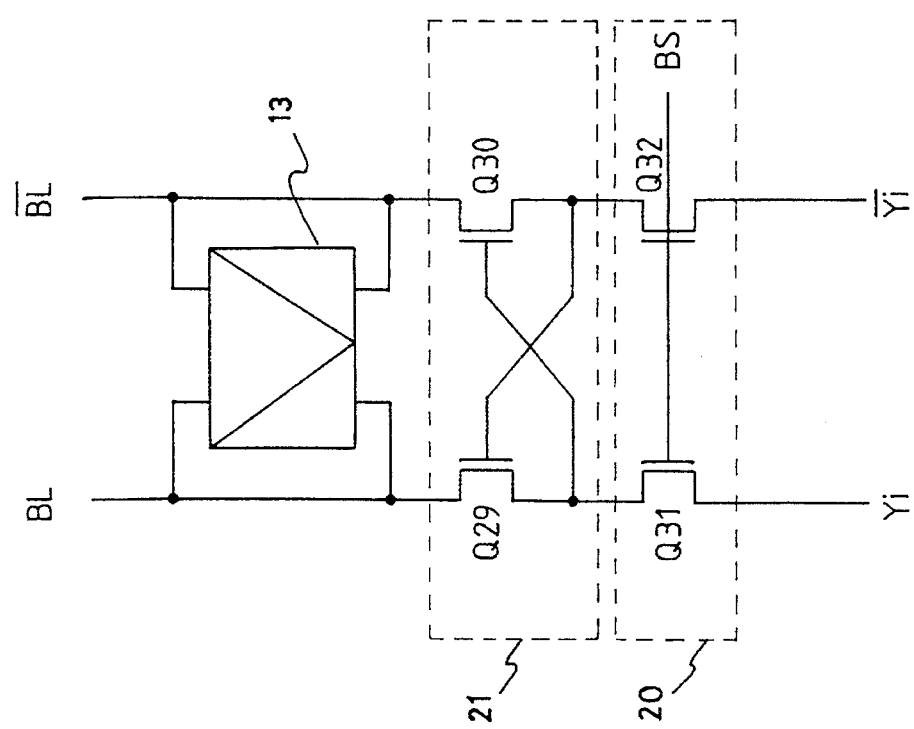
FIG. 5 is a circuit diagram of a data read/write apparatus for a semiconductor memory device in accordance with a third embodiment of the present invention.

Referring to FIG. 5, there is shown a circuit diagram of a data read/write apparatus for a semiconductor memory device in accordance with a third embodiment of the present invention. As shown in this drawing, the construction of the third embodiment is the same as that of the first embodiment in FIG. 3, with the exception that the first transfer transistor part 20 includes a pair of NMOS transistors Q35 and Q36 connected between the second transfer transistor part 21 and the column decoding lines Yi and /Yi and having their gate terminals for commonly inputting the block selection row address signal BS, and the second transfer transistor part 21 includes a pair of NMOS transistors Q33 and Q34 connected between the bit line sense amplifier 13 and the first transfer transistor part 20 and having their gate terminals cross coupled to the column decoding lines Yi and /Yi.

The operation of the third embodiment with the above-mentioned construction is performed in a similar manner to that of the first embodiment and a description thereof will thus be omitted. Noticeably, it is not necessary to bootstrap the block selection row address signal BS to the first transfer transistor part 20 because the gate terminals of the NMOS transistors Q33 and Q34 are directly connected in the cross coupled manner to the column decoding lines Yi and /Yi.

As apparent from the above description, in the case where the data read/write apparatus of the present invention is applied in a semiconductor memory device, the true and complementary column decoding lines are used to perform the data read/write operations, instead of true and complementary data input/output lines connected respectively to the true and complementary bit lines. Therefore, the data read/write apparatus of the present invention has the effect of reducing the area of a semiconductor memory chip.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for reading data from a semiconductor memory device, comprising the steps of:

selecting a memory cell array block from which data is to be read, in response to a row address signal;

selecting a column of the selected memory cell array block in response to a column address signal;

sense-amplifying data which are transferred from a memory cell of the selected column to a pair of bit lines of the selected column;

decoding a read signal and allowing a pair of column decoding lines of the selected column to become a desired logic state in accordance with the decoded result;

forming a current path between one of said column decoding lines and a ground terminal in response to the sense-amplified data on said bit lines;

selecting data on said column decoding lines; and sense-amplifying the selected data and outputting the sense-amplified data externally.

2. A method for writing data into a semiconductor memory device, comprising the steps of:

selecting a memory cell array block into which data is to be written, in response to a row address signal;

selecting a column of the selected memory cell array block in response to a column address signal;

allowing a pair of column decoding lines of the selected column to become a desired logic state in response to a write signal;

transferring data on one of said column decoding lines to a bit line sense amplifier connected to a memory cell of the selected column; and restoring data on the other column decoding line to a logic state opposite to that of the data on said one column decoding line.

3. A method for reading/writing data from/into a semiconductor memory device, comprising the steps of:

a) reading data from said semiconductor memory device, said data reading step including the steps of:

(a-1) selecting a memory cell array block from which data is to be read, in response to a row address signal;

(a-2) selecting a column of the memory cell array block selected at said step (a-1) in response to a column address signal;

(a-3) sense-amplifying data which are transferred from a memory cell of the column selected at said step (a-2) to a pair of bit lines of the selected column;

(a-4) decoding a read signal and allowing a pair of column decoding lines of the column selected at said step (a-2) to become a first logic state in accordance with the decoded result;

(a-5) forming a current path between one of said column decoding lines and a ground terminal in response to the sense-amplified data on said bit lines;

(a-6) selecting data on said column decoding lines; and (a-7) sense-amplifying the selected data and outputting the sense-amplified data externally; and (b) writing data into said semiconductor memory device, said data writing step including the steps of;

(b-1) selecting a memory cell array block into which data is to be written, in response to the row address signal;

(b-2) selecting a column of the memory cell array block selected at said step (b-1) in response to the column address signal;

(b-3) allowing a pair of column decoding lines of the column selected at said step (b-2) to become a second logic state in response to a write signal;

(b-4) transferring data on one of said column decoding lines to a bit line sense amplifier connected to a memory cell of the column selected at said step (b-2); and (b-5) restoring data on the other column decoding line to a logic state opposite to that of the data on said one column decoding line.

4. A method for reading/writing data from/into a semiconductor memory device, as set forth in claim 3, wherein said column decoding lines are both high in logic at the first logic state.

5. A method for reading/writing data from/into a semiconductor memory device, as set forth in claim 3, wherein only one of said column decoding lines is high in logic at the second logic state.

6. A method for reading/writing data from/into a semiconductor memory device, as set forth in claim 3, wherein the data on said one column decoding line at said step (b-4) is low in logic.

7. An apparatus for reading/writing data from/into a semiconductor memory device, comprising:

bit line sense amplification means for sense-amplifying data which are transferred from memory cells to a pair of bit lines;

column decoding means for outputting a first logic signal to a pair of column decoding lines in a read mode and a second logic signal to said pair of column decoding lines in a write mode in response to a column address signal, write input/output signals and a read/write signal;

first transfer transistor means connected between said bit lines and said column decoding lines, said first transfer transistor means being driven in response to a block selection row address signal;

second transfer transistor means connected in a cross coupled manner between said first transfer transistor means and said column decoding lines, said second transfer transistor means being driven in response to logic signals on said column decoding lines;

multiplexing means for transferring data on said column decoding lines of a selected column; and read sense amplification means for sense-amplifying the data transferred by said multiplexing means and transferring the sense-amplified data to a data output buffer.

8. An apparatus for reading/writing data from/into a semiconductor memory device, as set forth in claim 7, wherein said column decoding lines become both high in logic in response to the first logic signal.

9. An apparatus for reading/writing data from/into a semiconductor memory device, as set forth in claim 7, wherein only one of said column decoding lines becomes high in logic in response to the second logic signal.

10. An apparatus for reading/writing data from/into a semiconductor memory device, as set forth in claim 7, wherein said first and second transfer transistor means include MOS transistors.

11. An apparatus for reading/writing data from/into a semiconductor memory device, as set forth in claim 10, wherein said MOS transistors are of the N type.

12. An apparatus for reading/writing data from/into a semiconductor memory device, as set forth in claim 7, wherein said second transfer transistor means includes a pair of MOS transistors cross coupled between said bit line sense amplification means and said first transfer transistor means, and said first transfer transistor means includes a pair of MOS transistors connected between said second transfer transistor means and said column decoding lines and having their gate terminals for commonly inputting the block selection row address signal.

13. An apparatus for reading/writing data from/into a semiconductor memory device, as set forth in claim 7, wherein said first transfer transistor means includes a pair of MOS transistors connected between said second transfer transistor means and said column decoding lines and having their gate terminals for commonly inputting the block selection row address signal, and said second transfer transistor means includes a pair of MOS transistors connected between said bit line sense amplification means and said first transfer transistor means and having their gate terminals cross coupled to said column decoding lines.

* * * * *